(12) United States Patent
Arvin et al.

(10) Patent No.: US 10,916,507 B2
(45) Date of Patent: Feb. 9, 2021

(54) MULTIPLE CHIP CARRIER FOR BRIDGE ASSEMBLY

(71) Applicant: International Business Machines Corporation, Armonk, NY (US)

(72) Inventors: Charles L Arvin, Poughkeepsie, NY (US); Brian W Quinlan, Poughkeepsie, NY (US); Steve Ostrander, Poughkeepsie, NY (US); Thomas Weiss, Poughkeepsie, NY (US); Mark W Kapfhammer, Poughkeepsie, NY (US); Shidong Li, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/209,013

(22) Filed: Dec. 4, 2018

(65) Prior Publication Data

US 2020/0176383 A1 Jun. 4, 2020

(51) Int. Cl.
*H01L 23/538* (2006.01)
*H01L 25/065* (2006.01)
(Continued)

(52) U.S. Cl.
CPC ...... *H01L 23/5381* (2013.01); *H01L 21/4807* (2013.01); *H01L 21/4853* (2013.01);
(Continued)

(58) Field of Classification Search
CPC ... H01L 24/16; H01L 2224/81; H01L 23/528; H01L 25/0655; H01L 25/50; H01L 23/5385; H01L 23/42; H01L 23/3675; H01L 23/49816; H01L 23/13; H01L 23/3731; H01L 23/3185; H01L 23/5381; H01L 24/81; H01L 2224/81815; H01L 2224/16227; H01L 21/563;
(Continued)

(56) References Cited

U.S. PATENT DOCUMENTS 4,811,082 A 3/1989 Jacobs
4,922,377 A 5/1990 Matsumoto
(Continued)

FOREIGN PATENT DOCUMENTS

KR 101696065 B1 1/2017

*Primary Examiner* — Jasmine J Clark
(74) *Attorney, Agent, or Firm* — Jeffrey S LaBaw; Steven J Meyers

(57) ABSTRACT

A multiple chip carrier assembly including a carrier having a first surface and a second surface is attached to a plurality of chips is described. The plurality of chips include a first chip and a second chip. Each of the chips has first surface with a first set of solder balls for connecting to a package and a second set of solder balls for connecting to a high signal density bridge element. A second surface of each chip is bonded to the first surface of the carrier. A package has a first surface which is connected to the first sets of solder balls of the first and second chips. A high signal density bridge element having high signal density wiring on one or more layers is connected to the second sets of solder balls of the first and second chips. The bridge element is disposed between the first surface of the package and the first surfaces of the first and second chips.

23 Claims, 15 Drawing Sheets

(51) Int. Cl.
*H01L 23/00* (2006.01)
*H01L 23/31* (2006.01)
*H01L 23/373* (2006.01)
*H01L 25/00* (2006.01)
*H01L 21/48* (2006.01)
*H01L 21/56* (2006.01)

(52) U.S. Cl.
CPC ........ *H01L 21/563* (2013.01); *H01L 23/3185* (2013.01); *H01L 23/3731* (2013.01); *H01L 24/16* (2013.01); *H01L 24/81* (2013.01); *H01L 25/0655* (2013.01); *H01L 25/50* (2013.01); *H01L 2224/16227* (2013.01); *H01L 2224/81132* (2013.01); *H01L 2224/81815* (2013.01)

(58) Field of Classification Search
CPC ....... H01L 2224/81132; H01L 21/4807; H01L 21/4853
See application file for complete search history.

(56) References Cited

U.S. PATENT DOCUMENTS

| | | |
|---|---|---|
| 4,943,844 A | 7/1990 | Oscilowski |
| 6,921,972 B1 | 7/2005 | Hasemi |
| 7,058,247 B2 | 6/2006 | Crow |
| 7,098,542 B1 | 8/2006 | Hoang |
| 7,749,807 B2 | 7/2010 | Karnezos |
| 7,867,820 B2 | 1/2011 | Burrell |
| 8,008,764 B2 | 8/2011 | Joseph |
| 8,064,224 B2 | 11/2011 | Mahajan |
| 8,188,596 B2 | 5/2012 | Otremba |
| 8,213,184 B2 | 7/2012 | Knickerbocker |
| 9,418,966 B1* | 8/2016 | Kwon .................. H01L 25/072 |
| 2012/0261838 A1* | 10/2012 | Braunisch ............... H01L 23/13 257/777 |
| 2013/0168854 A1* | 7/2013 | Karikalan ............... H01L 24/17 257/738 |
| 2017/0125334 A1* | 5/2017 | Wang .................. H01L 23/3114 |
| 2019/0096812 A1* | 3/2019 | Teh ....................... H01L 21/563 |
| 2020/0098692 A1* | 3/2020 | Liff ..................... H01L 25/0655 |

* cited by examiner

MULTIPLE CHIP CARRIER FOR BRIDGE ASSEMBLY

BACKGROUND OF THE INVENTION

This disclosure generally relates to integrated circuit devices. More specifically, it relates to a method and structures for an advanced, packaging structure for connecting multiple dies via one or more bridges.

Semiconductor chips or "dies" have continued to become more complex and grow in size. The growth in the die size has resulted in lower yielding die, due to the manufacturing defect density staying a similar density through chip generations, but the die size of each generation increasing in size. Thus, each succeeding generation of chips has a greater chance to be impacted by random defects. While one approach is to reduce the manufacturing defect density, this is a difficult problem with the increasing complexity of the processing. Another approach to reduce yield loss is to reduce the size of the chip or die. However, once two or more die are created from the original chip, a greater amount of input and output (I/O) lines are needed to communicate between the chips at fast rates. The fast I/O rates are difficult to achieve with typical packaging.

To enable fast communication between respective dies, several "3-D" wiring designs have been used in the prior art. In some 3-D packages, multiple semiconductor chips are bonded together and electrically connected by means of through substrate vias (TSVs) to form a "chip stack". The chip stack is then attached to packaging. In other designs, silicon "interposers" have been used. An interposer is a silicon signal conduit used between the silicon chip(s) and the packaging. While as compared to the silicon chips in which the devices are fabricated the interposers are simpler, the interposers require TSV processes, temporary carriers and circuit attachments to both sides of the interposer. This leads to very cumbersome assembly processes, e.g., the release process from the temporary carriers used for many interposers is problematic.

Other efforts have included an "embedded silicon bridge" technology which uses a small (relative to the semiconductor chips it interconnects) piece of silicon called a "bridge" with routing layers which connect one chip to another which is embedded in the packaging. It has advantages over the 3-D chip stack or interposer technologies in that the silicon bridge eliminates the need for TSVs. The embedded bridge concept avoids some of the cost added by the interposer while still providing the high speed chip to chip wiring. By embedding the silicon bridge in the package substrate, physical support is provided for the fragile bridge by the packaging. However, the complexity of the package substrate is increased by the incorporation of the bridges into the respective substrate and adds to the number of custom packages as each combination of a respective package and a different bridge is a separate part number.

The present disclosure presents an advanced assembly and packaging approach for external silicon bridges between two or more dies.

SUMMARY OF THE INVENTION

According to this disclosure, in one aspect of the invention, a multiple chip carrier assembly including a carrier having a first surface and a second surface is attached to a plurality of chips. The plurality of chips include a first chip and a second chip. Each of the chips has first surface with a first set of solder balls for connecting to a package and a second set of solder balls for connecting to a high signal density bridge element. A second surface of each chip is bonded to the first surface of the carrier. A package has a first surface which is connected to the first sets of solder balls of the first and second chips. A high signal density bridge element having high signal density wiring on one or more layers is connected to the second sets of solder balls of the first and second chips. The bridge element is disposed between the first surface of the package and the first surfaces of the first and second chips.

In another aspect of the invention, the multiple chip assembly includes a first chip and a second chip. Each chip has first surface with a first set of solder balls for connecting to a package and a second set of solder balls for connecting with a high signal density bridge element. The package has a first surface connected to the first sets of solder balls of the first and second chips. The high signal density bridge element is connected to the second sets of solder balls of the first and second chips. The bridge element is disposed between the first surface of the package and the first surfaces of the first and second chips.

In another embodiment of the invention, a method of making a multiple chip carrier assembly is described. A first chip and a second chip are aligned with respect to one another using a first set of solder balls attached to a first surface each of the first and second chips. A second surface of the first and second chips are bonded to a first surface of a carrier. A high signal density bridge element is connected to a second set of solder balls on the first surface of the first and second chips. The bridge element has high signal density wiring on one or more layers. The first sets of solder balls of the first and second chips are connected to a package.

In another embodiment of the invention, a chip carrier for assembling a plurality of chips to a high density bridge element has a first surface and a second surface. The first surface is adapted to connect to a respective second surface of a first chip and a second chip. The first surface of each chip has a first set of solder balls for connecting the first and second chips to a package and a second set of solder balls for connecting the first and second chips to a high signal density bridge element.

The foregoing has outlined some of the more pertinent features of the disclosed subject matter. These features should be construed to be merely illustrative. Many other beneficial results can be attained by applying the disclosed subject matter in a different manner or by modifying the invention as will be described.

BRIEF DESCRIPTION OF THE DRAWINGS

For a more complete understanding of the present invention and the advantages thereof, reference is now made to the following descriptions taken in conjunction with the accompanying drawings which are not necessarily drawing to scale, and in which.

DETAILED DESCRIPTION OF THE DRAWINGS

At a high level, embodiments of the invention include a carrier which provides support for two or more dies or chips while at least one external bridge, e.g., a silicon bridge, is attached to the two or more dies producing a first assembly (including the carrier, the dies and the bridge(s)). The first assembly is subsequently attached to a package creating a second assembly. In embodiments of the invention, the carrier is a permanent carrier and becomes permanent part of the second assembly. In these embodiments, it is advantageous for the carrier to have good thermal transfer characteristics to dissipate heat from the functioning chips (dies). In other embodiments, the carrier is temporary. It provides support for the chips and bridges during the bonding operations, but is not a permanent part of the second assembly. In both classes of embodiments, it is desirable that the carrier have good coefficient of thermal expansion (CTE) characteristics to avoid stresses to the dies and bridges during the assembly process.

Given the deficiencies of the prior art, the inventors believe that it would be desirable to develop an "external bridge" structure to remove the silicon bridge from the package. This allows inter-chip communication through a structure more similar to an interposer-style packaging structure, but without the need for TSVs, dual sided plating, low yielding bond and assembly processes associated with the interposer. However, the fragility of the silicon bridges create significant challenges in handling and assembly.

Figure 1:
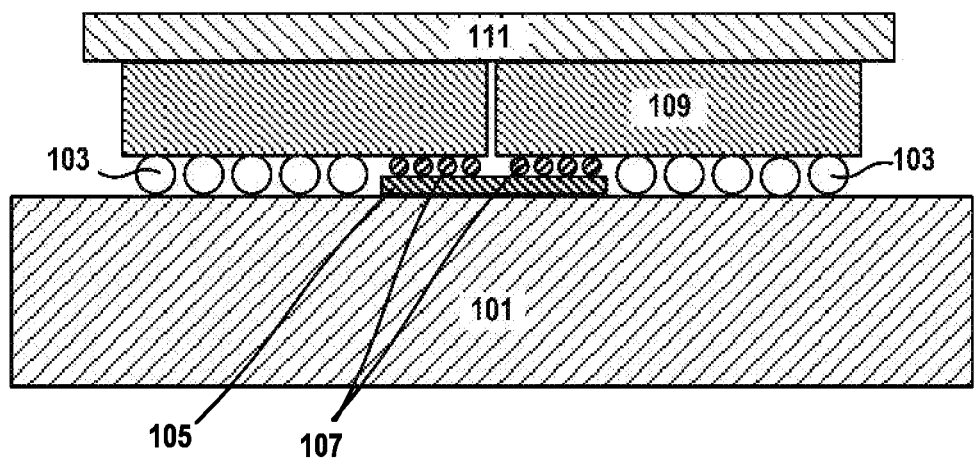
FIG. 1 is a cross-sectional drawing of a completed packaging structure according to a first embodiment of the invention.

FIG. 1 is a cross-sectional drawing of a completed packaging structure according to a first embodiment of the invention. This is the "second assembly" referred to above. In embodiments of the invention, the package 101 is an organic laminate structure having layers of metal circuitry alternating with an organic insulating material such as epoxy. Metal interconnects connect through the organic insulating material to respective metal circuitry layers. However, other conventional packages, such as ceramic packages, are used in other embodiments of the invention. There are solder pads (not shown) on the top surface of the package 101 for connecting to a set of solder balls 103 which are used to interconnect the package 101 to the semiconductor chips 109 (also called dies). The semiconductor chips 109 are also connected to the silicon bridge 105 by means of another set of solder balls 107. The semiconductor chips 109 are conventional except for their patterning which allows attachment to both the bridge 105 and package 101 on the same side of the chip 109 as illustrated. The bridge 105 is a high density structure containing electrically conductive lines which allow for high speed input-output (I/O) signals to be sent between the semiconductor chips 109 faster than would be possible through the circuitry in the package 101. The bridge 105 is disposed between the first surface of the package 101 and the first surfaces of the first and second chips 109.

The carrier 111 is bonded to the silicon chips 109. As discussed herein, the material selected for the carrier 111 has good CTE and thermal properties in the respective embodiments. In some embodiments, it acts as a heat sink. The coefficient of thermal expansion (CTE) describes how the size of an object changes with a change in temperature. Specifically, it measures the fractional change in size per degree change in temperature. The preferred range of CTE of the carrier is from an exact match to the CTE of the external bridge composite CTE to as much as ±7 $10^{-6}$/m K difference from the bridge composite CTE. A more preferred range is for the carrier CTE is not to vary from the bridge composite CTE by more than ±2 $10^{-6}$/m K to minimize the stresses applied to the bridge. Good materials for the carrier are silicon carbide (SiC), silicon (Si) and NiFe alloys. They can have CTEs ranging from 0.7 to 22 $10^{-6}$/m K which are similar to those of materials used for the external bridges. The CTEs of the carrier and bridge are said to "match" if they fall within the above described ranges.

As will be discussed below, the carrier 111 in some embodiments is nonplanar on the attachment side to account for different thicknesses of the silicon chips attached thereon. Also, in other embodiments, the carrier can have a protruding structure to act as a coupling device to the package 101 to reduce stresses transferred to the dies and the bridge during the assembly process. Those skilled in the art will appreciate that the drawing is not necessarily to scale and that the dimensions of the respective elements of the assembly will vary according to the design of the device in which the assembly will be incorporated.

The arrangement of the bridge 105 between the chips 109 and carrier 101 is similar in a way to the arrangement of an interposer-based package in that the bridge is disposed between the chips and package. However, an interposer extends the entire distance between the chips and package. Also as mentioned above, an interposer requires TSVs to electrically connect the chips to the package. Here, the bridge 105 supplies the high speed, high bandwidth communications between chips 109 using connections on a single, chip side of the bridge, and the chips 109 themselves are bonded directly to the package 111.

In this drawing, and those which follow, a carrier 111 adapted for two dies 109 is depicted for ease in illustration.

Other embodiments of the invention have carriers capable of connecting greater numbers of chips. The drawing is not scale. The carrier 101 in different embodiments of the invention ranges from 200 to 5000 um in thickness with a typical value of 2000 um. Solder balls 103 can range from 40 to 300 um in diameter with typical values of 60 um. The bridge 105 can range from 30 um to 200 um in thickness with preferred range of 40 to 80 um. The set of solder balls 107 can range from 5 to 50 um with a preferred range of 10 to 20 um. The semiconductor chips 109 can range from 100 to 785 um in thickness with a preferred range of 400 to 600 um. The package 111 can range from 200 um to 5000 um in thickness with a preferred range of 500 um to 2000 um. In typical embodiments, the aggregate thickness of the bridge 105 and the solder balls 107 is equal to or smaller than the thickness of the solder balls 103.

Figure 2:
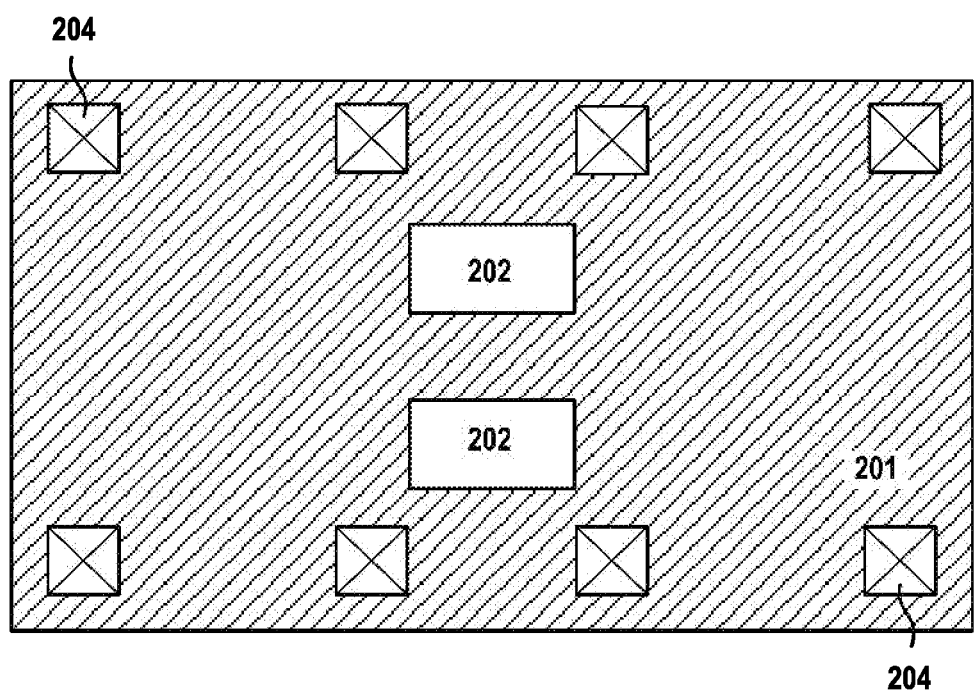
FIG. 2 is a top view of a jig used to fabricate a packaging structure according to a first embodiment of the invention.

FIG. 2 is a top view of a jig used to fabricate a packaging structure according to a first embodiment of the invention. The jig 201 is preferably fabricated from a material with good CTE characteristics such SiC to avoid thermal stresses on other components during the assembly process, e.g., when the jig stays in contact with the dies during the bridge reflow process (described below). Other embodiments utilize jigs made of silicon, CTE tailored glass and NiFe alloys that can be tuned to have CTEs ranging from 0.7 to 22 $10^{-6}$/m K. The jig 201 has holes 202 through which the bridges will be placed and thereby attached to the chips as is shown in later drawings. Also depicted are micro-machined registration marks 204 which allow accurate registration of the chips. The registration marks 204 are shown as pyramidal recesses, however, other shapes, such as conical or hemispherical recesses are used in other embodiments of the invention. The registration marks 204 can be formed utilizing Micro-Electro-Mechanical Systems (MEMS) technology; in the case of a silicon jig micromachining or alternatively electroforming techniques such as electroplating are used. Although only four registration marks 204 are shown for ease in illustration, in other embodiments, there are more registration marks. The registration marks 204 can be in locations which correspond to peripheral regions of the chips, e.g., corners of the chips. In embodiments of the invention, a recess (not shown) is formed in the jig 201 for each of the chips to allow the remaining solder balls, alternatively referred to as C4s, not used for registration to be free of the jig. In preferred embodiments, the jig 201 is patterned so that the registration marks position the dies relative to each other so the bridge will be properly connected directly to the two or more die. In embodiments of the invention in which more chips are part of the final assembly, the jig will have placement holes for bridges connecting those chips as well as additional registration marks for registering those chips.

Figure 3:
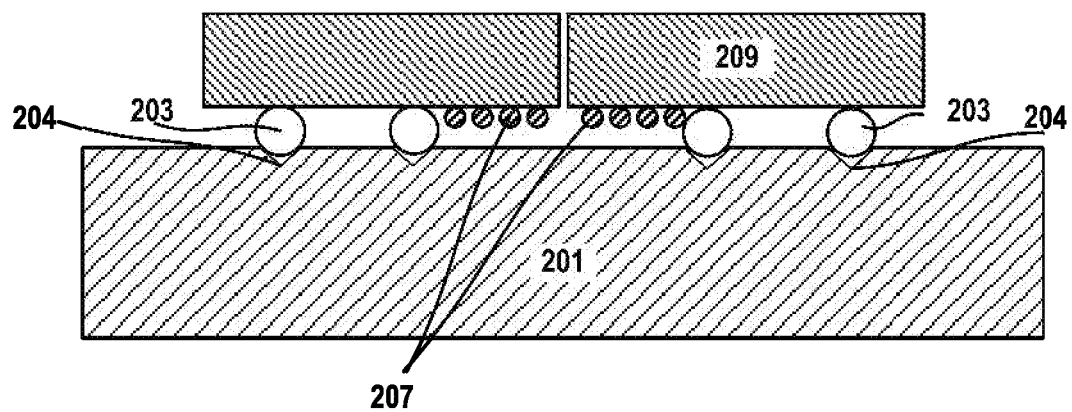
FIG. 3 is a cross-sectional drawing of two dies aligned to the jig according to a first embodiment of the invention.

FIG. 3 is a cross-sectional drawing of two dies aligned to the jig 201 according to a first embodiment of the invention. The assembly process depicted in the drawings takes components made from other processes, i.e., a chip manufacturing process, a bridge manufacturing process and a package manufacturing process. The jig 201 is shown in cross-section and the micro-machined registration marks 204 receive solder balls 203 which are soldered onto silicon chips 209. The solder balls 203 are soldered on to the bottom faces of the chips 209 in a prior step. For ease in illustration, only a subset of the solder balls 203 are shown, i.e. the ones used to register the chips to the jig 201 and therefore, the chips to each other. The solder balls 203 used for registration may be located at peripheral locations of the respective dies, e.g., outside a central region where the electrical connections between the chips and the package will be made. The majority of the solder balls in this set are used to attach the chips and package together, and are not shown in this drawing. The subset of solder balls 203 used to register the dies are used in some embodiments to create electrical connections. In other embodiments, the subset of solder balls 203 is only used for registration purposes.

Also shown in the drawing are the solder balls 207 which will be used to connect the bridge to the dies 209. The solder balls of 203 and 207 can either be made of materials with different melting points or with the same melting points. In some embodiments, it is preferred that the final joint of the solder balls 207 have a higher melting point than solder balls 203 by at least 50° C. The chips 209 are eventually attached to a substrate that has its own pre-solder on it.

Figure 4:
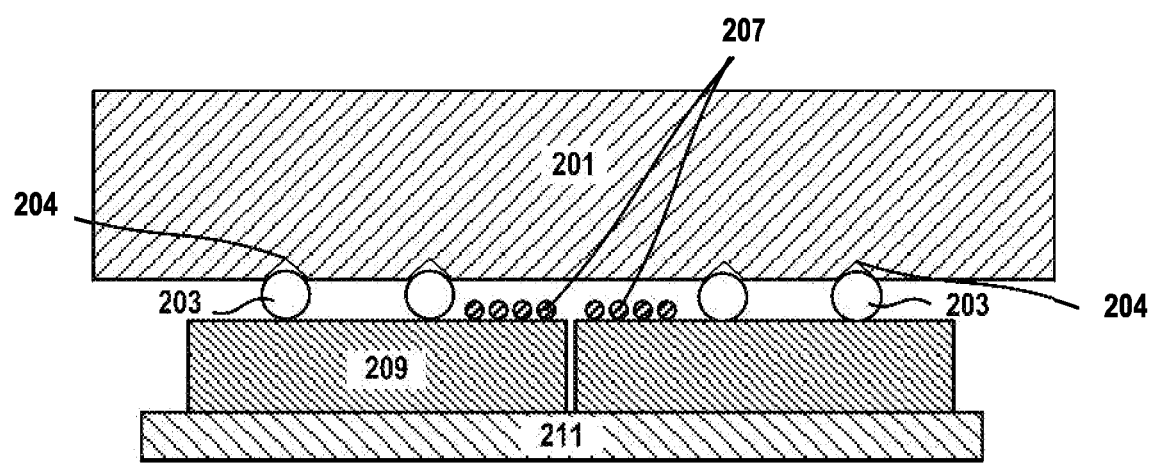
FIG. 4 is a cross-sectional diagram of the die carrier attached to the two dies while aligned to the jig according to a first embodiment of the invention.

FIG. 4 is a cross-sectional diagram of the die carrier attached to the two dies while aligned to the jig according to a first embodiment of the invention. First, the carrier 211 is attached to the chips 209 using either bonding methods such as Cu to Cu or oxide to oxide or adhesives such as Supreme 12AOHT-LO. Then the assembly is "flipped" into the opposite orientation. Because typical assembly flow picks and places the die onto the substrate, only a few specialized pick and place tools can pick up a laminate greater than 100 mm×100 mm. In the case of larger boards, there is a lack of tooling capable of picking up the board and placing it onto the two chip or multi-chip assembly. So the "flipped" position is preferred for existing tooling. The presence of the carrier 211 keeps the chips registered during the flip operation. In preferred embodiments, the carrier 211 is comprised of a material such as silicon carbide (SiC) which has good CTE characteristics to avoid thermal stresses in the assembly process. In this drawing, the orientation of the chips 209 is reversed (as compared to FIG. 3) as it shows the assembly in the "flipped" position, so that the solder ball faces of the chips 209 are now the top faces of the chips.

Figure 5:
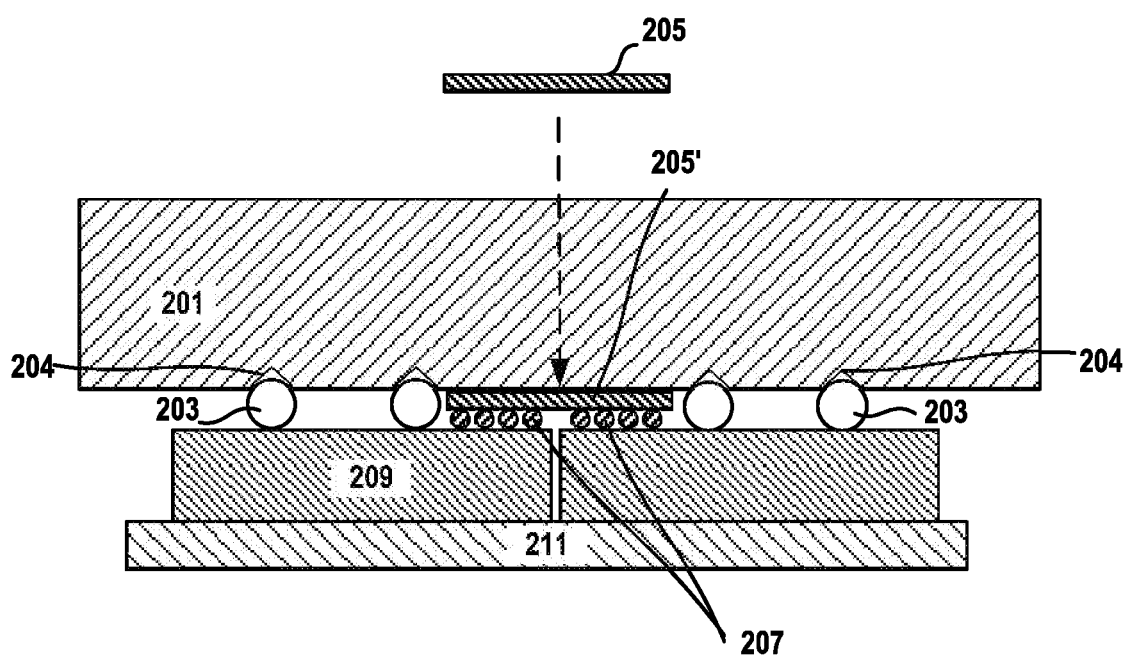
FIG. 5 is a cross-sectional drawing of the placement of a silicon bridge onto the two dies through the jig according to a first embodiment of the invention.

FIG. 5 is a cross-sectional drawing of the placement of a bridge onto the two dies through the jig according to a first embodiment of the invention. In this drawing, the bridge is shown both in a first position 205 before it is placed through a hole (shown in FIG. 2) in the jig 201 and the final position 205' where it is bonded to the two chips 209 by means of a bridge reflow process using the solder balls 207. The typical temperature of the bridge reflow operation ranges from 140° C. to 280° C. A standard pick and place tool is used to place the bridge (205, 205') through the holes in the jig 201. Only one bridge is shown for ease in illustration, but multiple bridges are used in other embodiments of the invention, and would be placed in this step, either to connect the same two dies 109 or to connect more than two dies in alternative embodiments.

A bridge 205 can be fabricated from silicon, ceramic, glass or organic materials. The choice of the material for the carrier 211 preferably changes based upon the choice of the material for the bridge 205. If the bridge material has a composite CTE of about 17 $10^{-6}$/m K, then one desired carrier material would be copper. If instead, the bridge is made of Si and has a CTE of 2.7 $10^{-6}$/m K, then a desired carrier material CTE would be about 2.7 $10^{-6}$/m K. The bridge is relatively small as compared to other elements of the assembly, e.g., less than a tenth of the area of the chip. The bridge has the die-to-die wiring on a single side of the bridge as compared to an interposer which has connections on both sides of the interposer. After bonding, the bridge 205' is electrically connected directly to the two dies 209 by the set of solder balls 207.

Figure 6:
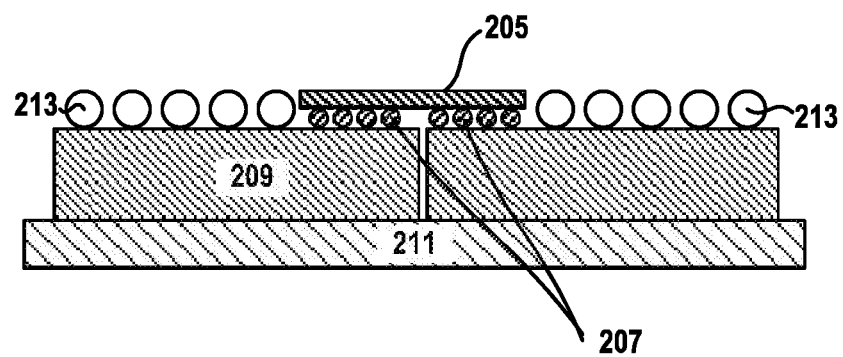
FIG. 6 is a cross-sectional diagram of the two dies attached to the die carrier and the silicon bridge after the removal of the jig according to a first embodiment of the invention.

FIG. 6 is a cross-sectional diagram of the two dies attached to the die carrier and the silicon bridge after the removal of the jig according to a first embodiment of the invention. In addition to the jig removal, this drawing shows a more complete (but still simplified) set of solder balls 213 placed on the chips 209 for electrical connection to the package in future steps. Since the jig is not physically connected to the dies, but rather is simply a device used for alignment, removing the jig is a simple operation of lifting of the jig off of the dies. As is mentioned elsewhere, the solder balls used for registration to the jig may or may not be members of the set of solder balls used to make electrical connections in different embodiments of the invention. That is, in some embodiments, a subset of the C4/solder balls on the dies were used to align the dies relative to each other and to the jig are part of the aggregate set of C4s which are used to connect the dies to the package. For example, in a preferred embodiment, there are 15,000 C4s per die for connections to the package. Only a small fraction of the corner C4s (e.g., ~5 per corner) are used for the registration of the die to the jig. The jig itself has a slight recess for all of the other C4s for each die so that they do not contact the jig.

Figure 7:
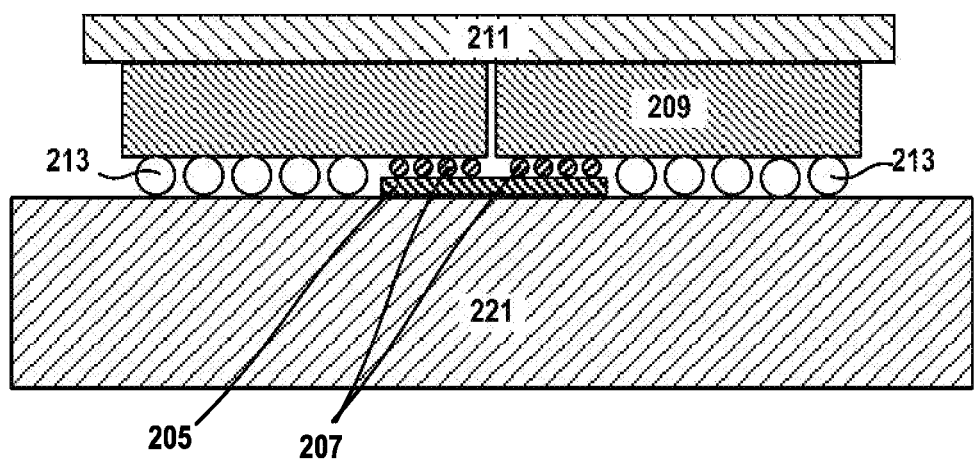
FIG. 7 is a cross-sectional diagram of the two dies attached to the die carrier, the silicon bridge and the package in a first embodiment of the invention.

FIG. 7 is a cross-sectional diagram of the two dies attached to the die carrier, the silicon bridge and the package in a first embodiment of the invention. This is the second assembly as discussed above for some embodiments of the invention. The chips 209 are electrically connected to the package 221 by means of the set of solder balls 213. As shown, the die-to-die wiring (solder balls 207) to the bridge 205 is on same side of the dies 209 that they are joined to the package 211 (by means of solder balls 213). In all embodiments of the invention, there are no electrical connections between the bridge 205 and the package 221. In embodiments of the invention, the space between the dies 209 and the substrate 221 is equal to or greater than the thickness of the bridge 205 plus its solder joints 207.

This drawing depicts an example of embodiments of the invention in which the carrier 211 becomes a permanent part of the second assembly. In such cases, it is preferred that the carrier 211 have good thermal properties to function as a heat sink or heat conductor to transfer heat away from the semiconductor chips 209. One advantage of the invention as compared to a prior art bridge embedded in the organic package is that the different CTEs of the organic package and the silicon bridge do not cause delamination of the embedded bridge from the organic package.

Figure 8:
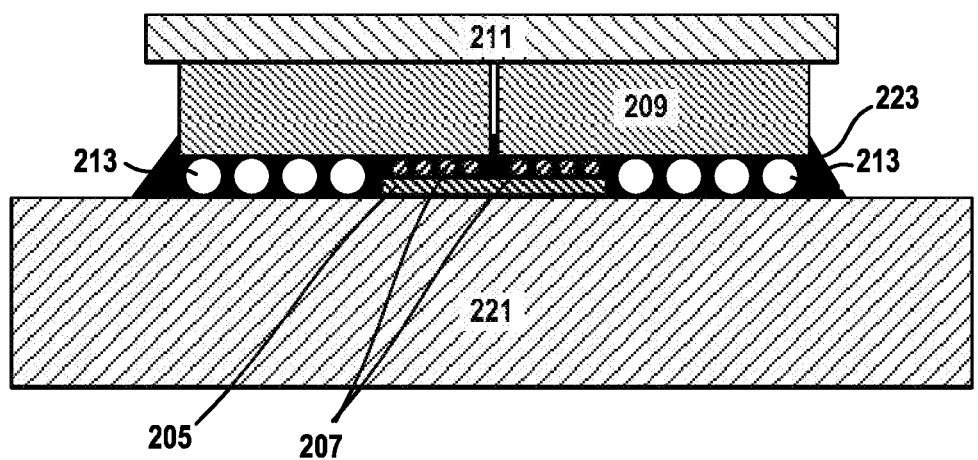
FIG. 8 is a cross-sectional diagram of the two dies attached to the die carrier, the silicon bridge and the package in a second embodiment of the invention.

FIG. 8 is a cross-sectional diagram of the two dies attached to the die carrier, the silicon bridge and the package in a second embodiment of the invention. This embodiment is similar to that depicted in FIG. 7 except with the addition of a conventional underfill 223 such as a capillary underfill used to offer mechanical support to the package. The underfill 223 lessens any issue with tin whisker growth reducing the lifetime of the package. In these embodiments, an organic epoxy filled with silica or other material is injected between the package and the other components. Once cured, the underfill 223 distributes the stresses across the entire package and reduce the stresses on the chip 209 and bridge 205 providing structural support for the assembly as a whole.

Figure 9:
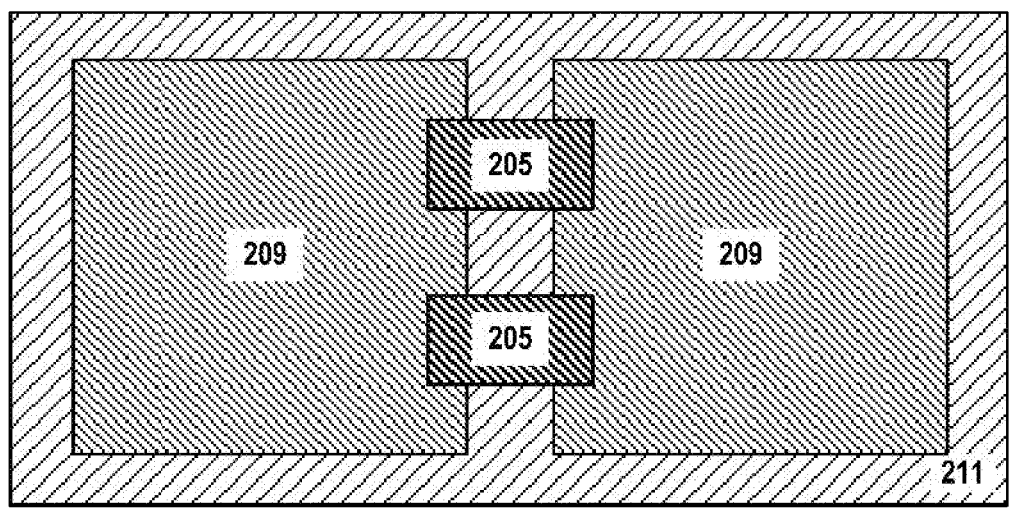
FIG. 9 is a top view diagram of the two dies attached to the die carrier and two silicon bridges in the first embodiment of the invention.

FIG. 9 is a top view diagram of the two dies attached to the die carrier and two silicon bridges in the first embodiment of the invention. In this embodiment, the carrier 211 is larger in area than the chips 209 or the bridges 205. In this embodiment, it is desirable that the carrier have good thermal properties, if it becomes a permanent part of the second assembly.

The use of a large carrier is preferred when the carrier 211 is temporary, as the maximum size of the carrier 211, being larger than the chips 209 and other elements, provides increased structural integrity during the assembly process as compared other embodiments which use smaller carriers. In this embodiment, the carrier is larger than and extends further than the extent of the semiconductor chips 209 in both a horizontal and vertical dimension.

Figure 10:
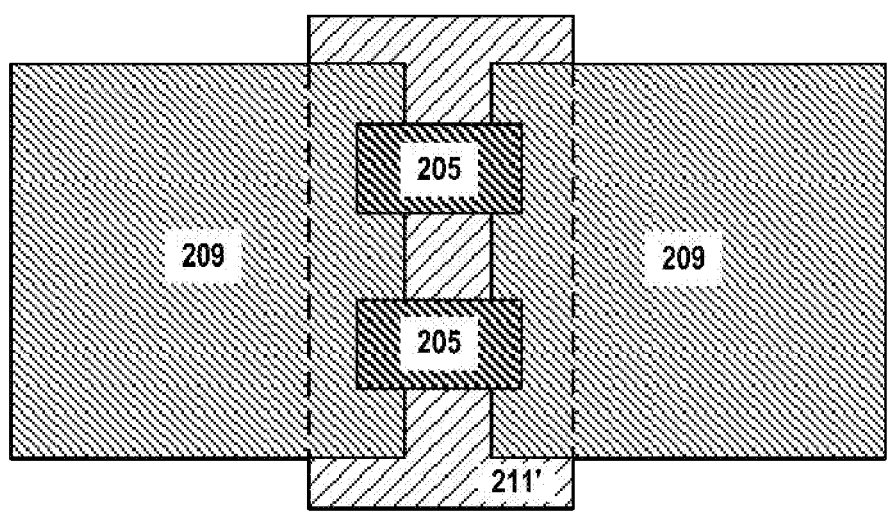
FIG. 10 a top view diagram of the two dies attached to the die carrier and two silicon bridges in a third embodiment of the invention.

FIG. 10 a top view diagram of the two dies attached to the die carrier and two silicon bridges in a third embodiment of the invention. In this embodiment, the carrier 211' provides support for the fragile bridges 205, however, the carrier is not larger than nor extends further than the extent of the semiconductor chips 209 in a horizontal direction. This embodiment allows better access to the chips 209 for superior heat sinks on that portion of the chips not covered by the carrier 211'. The heat sinks (not pictured) preferably have better thermal characteristics in terms of thermal dissipation than the carrier 211' material, but do not need to have as good CTE characteristics as they are added after the bridge assembly process. This embodiment allows the designer to make trade-offs between the bridge assembly process and the final operating environment. In this embodiment, one of the dimensions of the carrier is larger than the aggregate dimension of the chips, but the other is not. The larger dimension of the carrier in one direction allows for improved handling of the first assembly as well as access to the backs of the chips for heat sinks.

Figure 11:
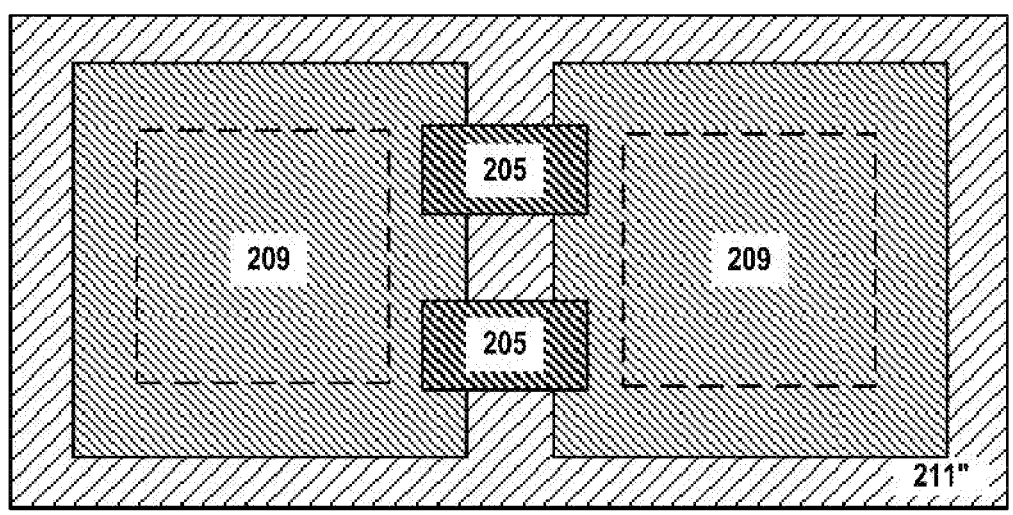
FIG. 11 a top view diagram of the two dies attached to die carrier and two silicon bridges in a fourth embodiment of the invention.

FIG. 11 a top view diagram of the two dies attached to die carrier and two silicon bridges in a fourth embodiment of the invention. The dotted lines behind the chips 209 indicate cut-outs in the carrier 211" to allow contact with a better heat sink (than the carrier) to be in contact with the back of the chips 209. As compared to the third embodiment, depicted in FIG. 10, the "8" or "hollowed" shape of the carrier 211" provides improved structural support in the assembly process at the possible expense of access (depending on the size of the cut-outs) to the chips 209 for a later attached heat sink (not pictured). A variation of this embodiment provides the carrier in an "H" shape where the cut-outs extend to the left and right of the chips 209.

Figure 12:
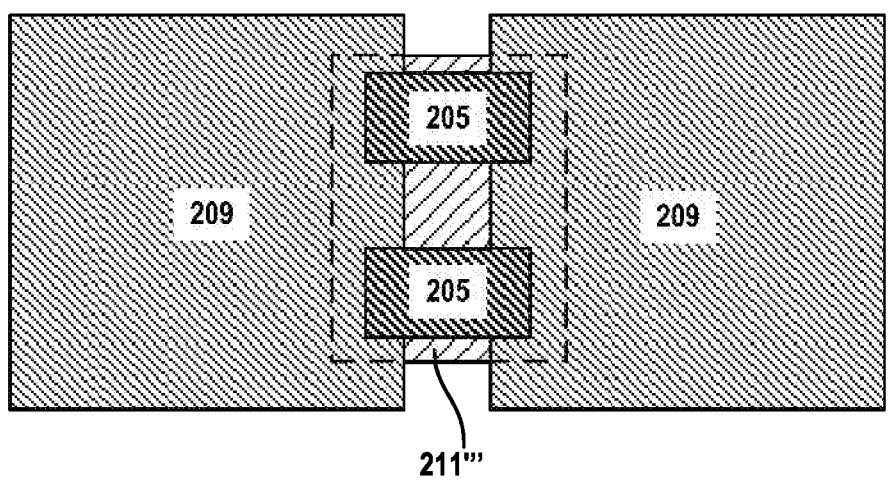
FIG. 12 a top view diagram of the two dies attached to the die carrier and two silicon bridges in a fifth embodiment of the invention.

FIG. 12 a top view diagram of the two dies attached to the die carrier and two silicon bridges in a fifth embodiment of the invention. As compared to the third embodiment of FIG. 10, the carrier 211' provides less support to the bridges 205 and ease in handling during the assembly process, but greater access to the chips 209 for a heat sink. In this embodiment, the carrier 211'" is smaller than the extent of the chip 209 in both the horizontal and vertical dimensions. A heat sink with superior heat dissipation characteristics as compared to the carrier is desired during operation of the chips in the final operating environment in some embodiments.

Figure 13:
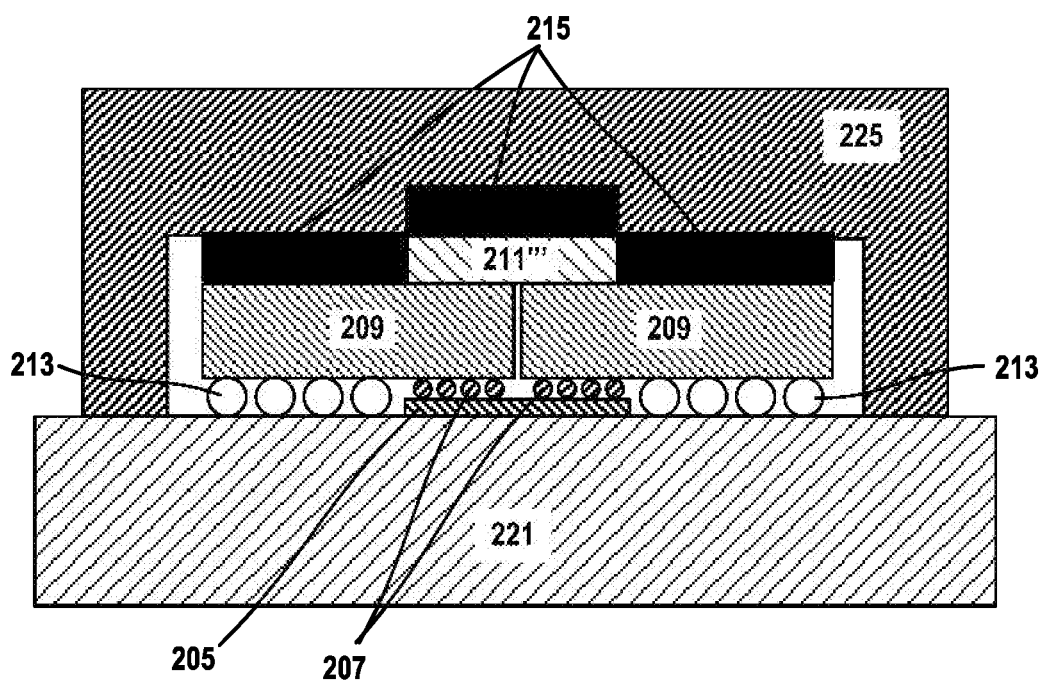
FIG. 13 a cross-sectional diagram of the two dies attached to a die carrier, two silicon bridges, the die carrier and a heat sink in a sixth embodiment of the invention.

FIG. 13 a cross-sectional diagram of the two dies attached to a die carrier, two silicon bridges, the die carrier and a heat sink in a sixth embodiment of the invention. As shown in the drawing, the heat sink 225 is thermally coupled to the chips 209 using a thermal paste 215 in the areas of the chips 209 which are not connected to the carrier 211"". Processes for the attachment of a heat sink to a package are well known to those skilled in the art. The heat sink 223 is also thermally coupled to the carrier 211"". Since the heat sink 225 has better thermal characteristics, e.g., as a heat sink, than the carrier 211'", during normal operation of the assembly, it is better for chips 209 which generate a significant amount of heat to have more direct contact with the heat sink 225 than with the carrier 211"". So to the extent that the area of the carrier 211"" can be reduced while still adequately supporting the fragile bridges 205 during the assembly process, the size of the carrier 211"" can be reduced for better heat dissipation during normal operation of the device.

Figure 14:
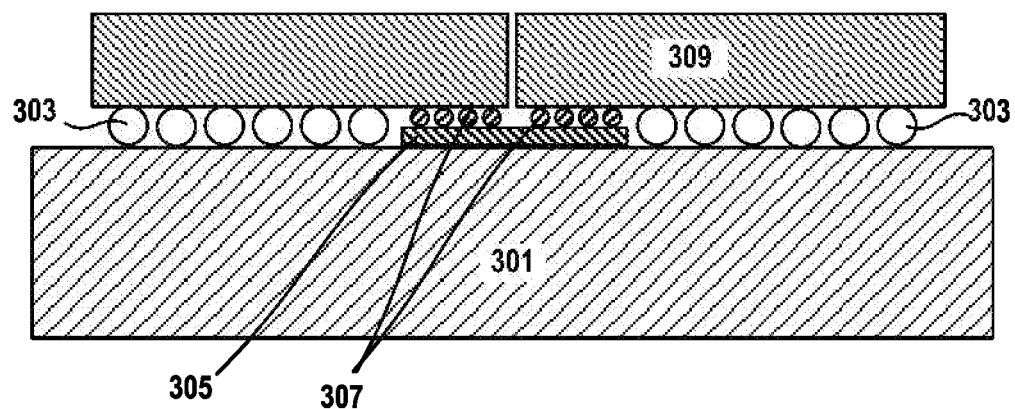
FIG. 14 is a cross-sectional diagram of the two dies attached to the die carrier, the silicon bridge and the package in a seventh embodiment of the invention.

FIG. 14 is a cross-sectional diagram of the two dies attached to the die carrier, the silicon bridge and the package in a seventh embodiment of the invention. In this embodiment, the carrier is removed after placement of the chips and bridge on the package. In this embodiment, the carrier is a temporary carrier, and its CTE properties are more important than its heat sink properties as the carrier is only present during the assembly process and not present during the normal operation of the chips in the functioning device. The temporary carrier would typically be removed after die attach, but could also be removed after underfill apply and cure. Different release mechanisms exist for removing the temporary carrier depending upon the method of initially attaching the carrier to the dies. This release mechanism can be a laser ablation method if a transparent carrier, e.g., glass, were used. In the alternative, an infrared (IR) laser method could be used to remove a silicon carrier attached to the silicon die with Cu bonding.

Figure 15:
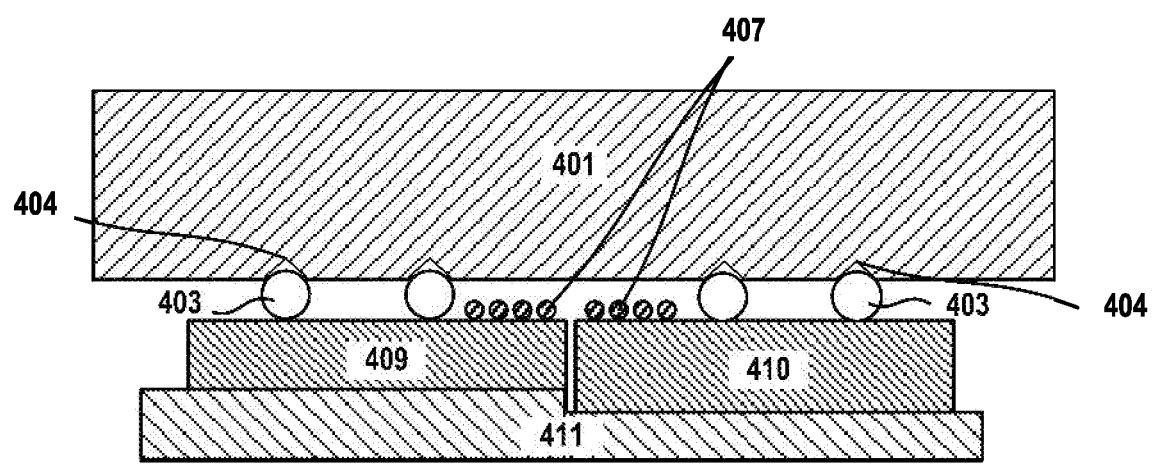
FIG. 15 is a cross-sectional diagram of a stepped die carrier attached to the two dies of different thicknesses while aligned to the jig according to an eighth embodiment of the invention.

FIG. 15 is a cross-sectional diagram of a stepped die carrier attached to the two dies of different thicknesses while aligned to the jig according to an eighth embodiment of the invention. As shown, the stepped die carrier 411 has a stepped cross-section to accommodate semiconductor chips of different thicknesses. As illustrated, semiconductor chip 409 is thinner than semiconductor chip 410. The stepped profile of the carrier 411 allow the top surfaces of the chips 409, 410 to be co-planar with each other during the assembly process. In this embodiment, the stepped profile may be provided by chip-sized recesses in the carrier as opposed to a step that extends to the periphery of the carrier 411.

The present invention has many advantages over the prior art. Embodiments of this invention utilize a permanent carrier for placement of a fragile bridge structure between two chips. The described process enables the alignment of multiple chips relative to each other to and to the subsequently attached bridges. Using this system, the stresses are removed from the bridges during the assembly process to allow a high yielding assembly builds. In preferred embodiments, the carrier possesses both good CTE and thermal sink characteristics to both reduce stresses during the assembly process and to provide a heat sink for the normal operating environment conditions of the chips.

In alternative embodiments, carrier configurations allow direct connection of the dies with an auxiliary heat sink. These embodiments are useful where there are high thermal removal needs during normal operation of the chips. Carrier configurations which allow access to the chips are also used in embodiments where a carrier material with good CTE, but poor thermal sink characteristics is used for the carrier.

In yet other embodiments, a temporary carrier with good CTE characteristics is used during the assembly process to provide support for the fragile bridge, but is removed. In this embodiment, full heat sinks may be provided in a subsequent step where there are high thermal removal needs during normal operation of the chips. However, in situations where the operating conditions of the chips do not require heat sinks, the temporary carrier embodiments do not require a heat sink to be added.

While only one or a limited number of features are illustrated in the drawings, those ordinarily skilled in the art would understand that many different types of features could be simultaneously formed with the embodiment herein and the drawings are intended to show simultaneous formation of multiple different types of features. However, the drawings have been simplified to only show a limited number of features for clarity and to allow the reader to more easily recognize the different features illustrated. This is not intended to limit the invention because, as would be understood by those ordinarily skilled in the art, the invention is applicable to structures that include many of each type of feature shown in the drawings.

While the above describes a particular order of operations performed by certain embodiments of the invention, it should be understood that such order is exemplary, as alternative embodiments may perform the operations in a different order, combine certain operations, overlap certain operations, or the like. References in the specification to a given embodiment indicate that the embodiment described may include a particular feature, structure, or characteristic, but every embodiment may not necessarily include the particular feature, structure, or characteristic.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Having described our invention, what we now claim is as follows:

1. A multiple chip carrier assembly comprising:
   a carrier having a first surface and a second surface;
   a first chip and a second chip, each chip having a first surface with a first set of solder balls and a second set of solder balls, a second surface of each chip bonded to the first surface of the carrier;

a package having a first surface connected to the first sets of solder balls of the first and second chips; and a high signal density bridge element having a high signal density wiring on one or more layers connected to the second sets of solder balls of the first and second chips, the bridge element disposed between the first surface of the package and the first surfaces of the first and second chips;

wherein a coefficient of thermal expansion (CTE) of the carrier matches a CTE of the bridge element.

2. The multiple chip carrier assembly as recited in claim 1, wherein the carrier has a stepped first surface to accommodate a difference in a thickness of the first chip and a thickness of the second chip to cause the first and second sets of solder balls of the first chip and the first and second sets of solder balls of the second chip to be on a same plane.

3. The multiple chip carrier assembly as recited in claim 1, wherein the carrier functions as a heat sink and is made of silicon carbide.

4. The multiple chip carrier assembly as recited in claim 1, further comprising a second high signal density bridge element connected to the second sets of solder balls of the first and second chips, the second bridge element disposed above the first surface of the package.

5. The multiple chip carrier assembly as recited in claim 1, wherein the high signal density bridge element is comprised of silicon.

6. The multiple chip carrier assembly as recited in claim 1, wherein the package is an organic laminate structure.

7. The multiple chip carrier assembly as recited in claim 1, wherein the coefficient of thermal expansion (CTE) of the carrier matches the CTE of the bridge element within a range of $\pm 7\ 10^{-6}$/m K difference between respective CTEs.

8. The multiple chip carrier assembly as recited in claim 1, wherein the first set of solder balls has a lower melting point than the second set of solder balls.

9. The multiple chip assembly as recited in claim 1 further comprising an additional heat sink attached to a second surface of the first and second chips.

10. A multiple chip assembly comprising:

a first chip and a second chip, each chip having a first surface with a first set of solder balls and a second set of solder balls;

a carrier attached to portions of second surfaces of the first and the second chips so that other portions of the second surfaces of the first and second chips can be attached to a heat sink;

a package having a first surface connected to the first sets of solder balls of the first and second chips; and a high signal density bridge element having a high signal density wiring on one or more layers connected to the second sets of solder balls of the first and second chips, the bridge element disposed between the first surface of the package and the first surfaces of the first and second chips.

11. The assembly as recited in claim 10 further comprising a heat sink attached to the other portions of the second surfaces of the first and second chips.

12. A method of making a multiple chip carrier assembly comprising:

aligning a first chip and a second chip using a first set of solder balls attached to a first surface each of the first and second chips, wherein a subset of the first set of solder balls for connecting to the package are used to align the first and second chips to a jig;

bonding a second surface of the first and second chips to a first surface of a carrier;

connecting a high signal density bridge element to a second set of solder balls on the first surface of the first and second chips, the bridge element having a high signal density wiring on one or more layers and the bridge element is placed on the second set of solder balls through a hole in the jig; and connecting the first sets of solder balls of the first and second chips to a package.

13. The method as recited in claim 12, wherein the carrier has a stepped first surface to accommodate a difference in a thickness of the first chip and a thickness of the second chip to cause the first and second sets of solder balls of the first chip and the first and second sets of solder balls of the second chip to be on a same plane.

14. The method as recited in claim 12, wherein the carrier functions as a heat sink during normal operation of the first and second chips.

15. The method as recited in claim 12, further comprising removing the carrier from the first and second chips after the first set of solder balls is connected to the package.

16. The method as recited in claim 12, further comprising removing the carrier, the bridge element and the first and second chips from the jig.

17. The method as recited in claim 12, wherein a coefficient of thermal expansion (CTE) of the carrier matches a CTE of the bridge element.

18. The method as recited in claim 12, further comprising adding an underfill for mechanical support to the package.

19. The method as recited in claim 12, further comprising attaching a heat sink to at least a portion of the second surfaces of the first and second chips and the second surface of the carrier.

20. The method as recited in claim 19, wherein a thickness of the first set of solder balls is greater than a combined thickness of the second set of solder balls and the bridge element.

21. A chip carrier for assembling a plurality of chips to a high density bridge element comprising:

a carrier having a first surface and a second surface, the first surface adapted to connect to a respective second surface of a first chip and a second chip, wherein a first surface of each chip has a first set of solder balls for connecting the first and second chips to a package and a second set of solder balls for connecting the first and second chips to a high signal density bridge element, wherein a coefficient of thermal expansion (CTE) of the carrier is selected to match a CTE of the high signal density bridge element to be attached to the first and second chips.

22. The chip carrier as recited in claim 21, wherein the carrier has a stepped first surface to accommodate a difference in a thickness of the first chip and a thickness of the second chip to cause the first and second sets of solder balls of the first chip and the first and second sets of solder balls of the second chip to be on a same plane.

23. The chip carrier as recited in claim 21, wherein the coefficient of thermal expansion (CTE) of the carrier is selected to match the CTE of the high signal density bridge element to be attached to the first and second chips within a range of $\pm 7\ 10^{-6}$/m K difference between respective CTEs.

* * * * *